United States Patent
Park

(10) Patent No.: US 10,926,293 B2
(45) Date of Patent: Feb. 23, 2021

(54) VIBRATION PROVISION SYSTEM FOR PROVIDING REAL-TIME VIBRATION ACCORDING TO FREQUENCY CHANGE AND VIBRATION PROVISION METHOD THEREFOR

(71) Applicant: Jae Seong Park, Seoul (KR)

(72) Inventor: Jae Seong Park, Seoul (KR)

(*) Notice: Subject to any disclaimer, the term of this patent is extended or adjusted under 35 U.S.C. 154(b) by 457 days.

(21) Appl. No.: 15/757,898

(22) PCT Filed: Sep. 5, 2016

(86) PCT No.: PCT/KR2016/009924
§ 371 (c)(1),
(2) Date: Mar. 6, 2018

(87) PCT Pub. No.: WO2017/043825
PCT Pub. Date: Mar. 16, 2017

(65) Prior Publication Data
US 2020/0230649 A1    Jul. 23, 2020

(30) Foreign Application Priority Data

Sep. 8, 2015 (KR) .......................... 10-2015-0126932

(51) Int. Cl.
*G08B 6/00* (2006.01)
*B06B 1/02* (2006.01)
(Continued)

(52) U.S. Cl.
CPC .............. *B06B 1/0238* (2013.01); *G08B 6/00* (2013.01); *H04R 3/00* (2013.01); *B06B 2201/30* (2013.01);
(Continued)

(58) Field of Classification Search
CPC ..... B06B 1/0238; B06B 2201/30; G08B 6/00; H04R 3/00; G06F 3/03543; H03G 3/30; H04M 1/03
See application file for complete search history.

(56) References Cited

U.S. PATENT DOCUMENTS 6,280,329 B1 * 8/2001 Kondo ................... A63F 13/10
463/43
7,755,433 B2    7/2010 Ikeda
(Continued)

FOREIGN PATENT DOCUMENTS

JP      2009-010741 A     1/2009
KR  10-20110108164 A    10/2011
(Continued)

OTHER PUBLICATIONS

International Search Report from Korean International Appln. No. PCT/KR2016/009924 dated Dec. 14, 2016.

*Primary Examiner* — Phung Nguyen
(74) *Attorney, Agent, or Firm* — Bacon & Thomas, PLLC

(57) ABSTRACT

Disclosed is a vibration provision system for providing real-time vibration according to a frequency change, including a communication unit 110 configured to receive a signal which is output from a computer, a game machine, or a portable terminal via wired or wireless communication; a conversion unit 120 configured to convert a sound signal transmitted from the communication unit 110 to a vibration signal which is capable of driving a vibrator on a real time basis by amplifying the transmitted sound signal; and a vibrator 130 configured to vibrate according to a vibration signal transmitted from the conversion unit 120, and the present invention provides a haptic signal which is suitable for an image and sound output from a portable terminal realistically and rapidly and thus has an effect to transmit (Continued)

information more realistically by visual, auditory, and tactile sense to a hardware environment requiring three-dimensional vibration.

10 Claims, 6 Drawing Sheets

(51) Int. Cl.
    *H04R 3/00*     (2006.01)
    *G06F 3/0354*     (2013.01)
    *H03G 3/30*     (2006.01)
    *H04M 1/03*     (2006.01)

(52) U.S. Cl.
    CPC ........... *G06F 3/03543* (2013.01); *H03G 3/30* (2013.01); *H04M 1/03* (2013.01)

(56) References Cited

U.S. PATENT DOCUMENTS

| | | | |
|---|---|---|---|
| 2001/0016518 A1* | 8/2001 | Nishiumi | A63F 13/24 463/36 |
| 2006/0199645 A1* | 9/2006 | Canterbury | G07F 17/32 463/43 |
| 2009/0002078 A1 | 1/2009 | Ikeda | |
| 2011/0128132 A1* | 6/2011 | Ullrich | G06F 3/16 340/407.1 |
| 2015/0350146 A1* | 12/2015 | Cary | H04L 67/2823 709/206 |

FOREIGN PATENT DOCUMENTS

| | | |
|---|---|---|
| KR | 10-2012-0058961 A | 6/2012 |
| KR | 10-20150082900 A | 7/2015 |
| KR | 10-2015-0101967 A | 9/2015 |

\* cited by examiner

[FIG.1]
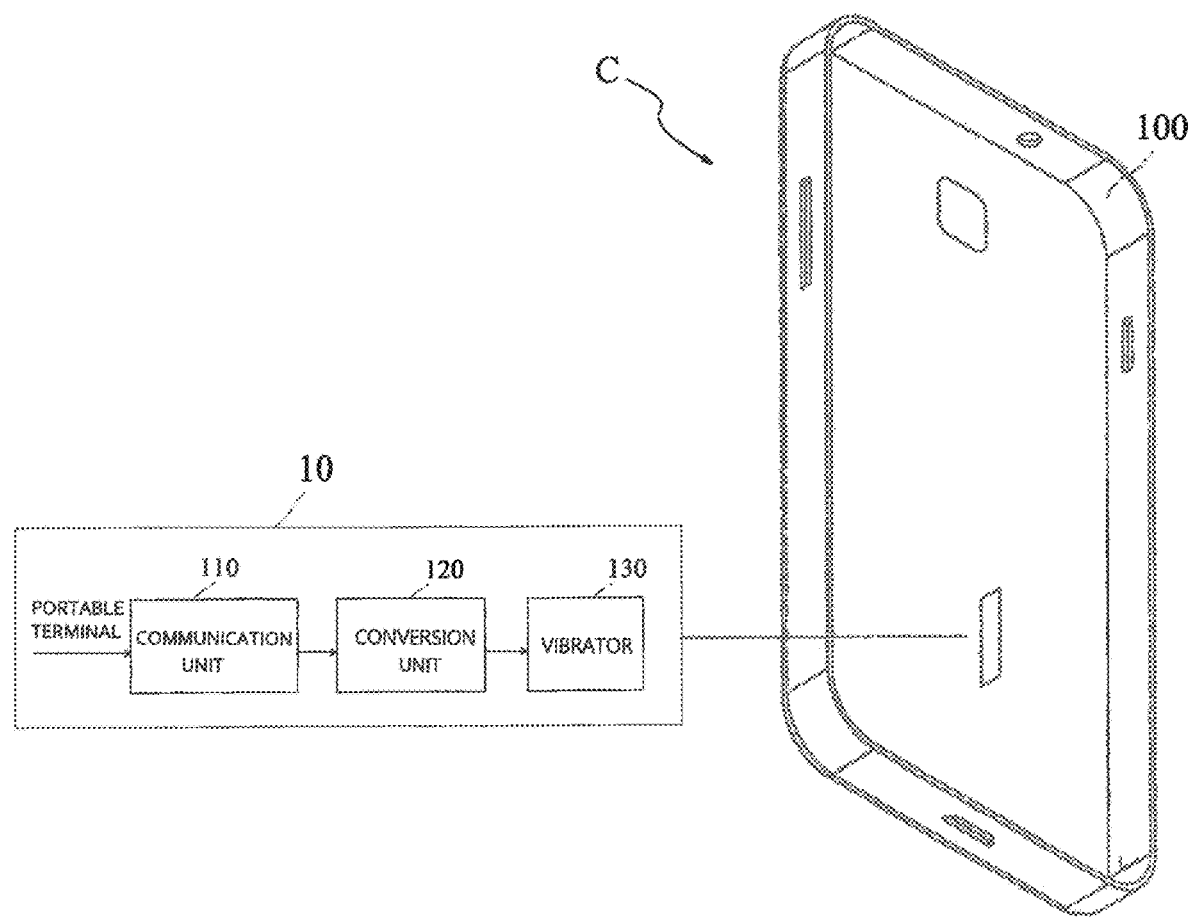

[FIG. 2]
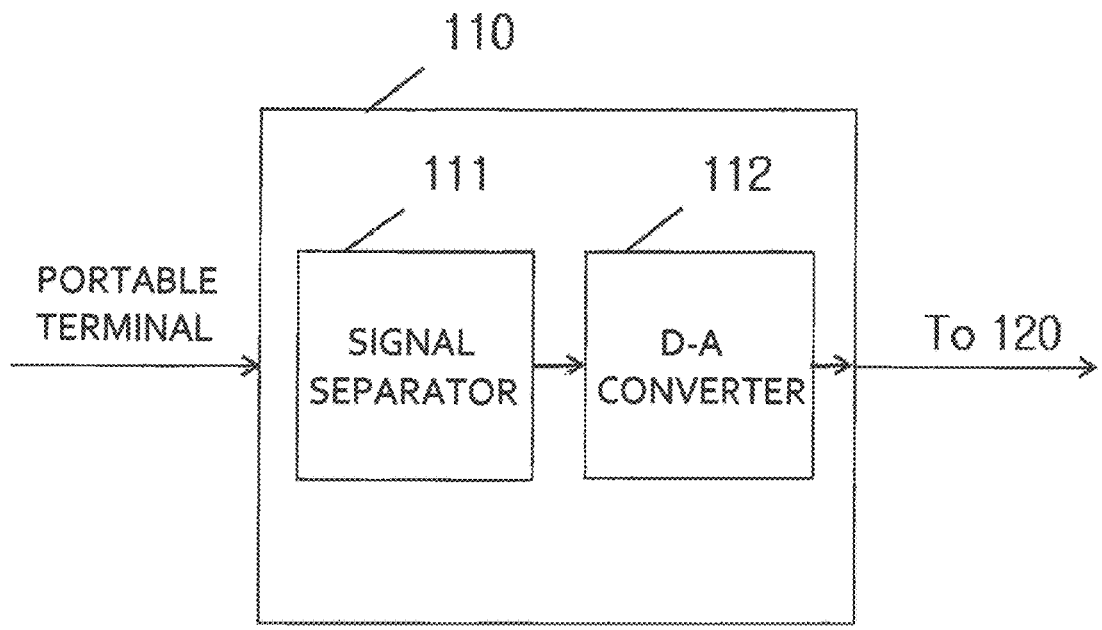
[FIG. 3]
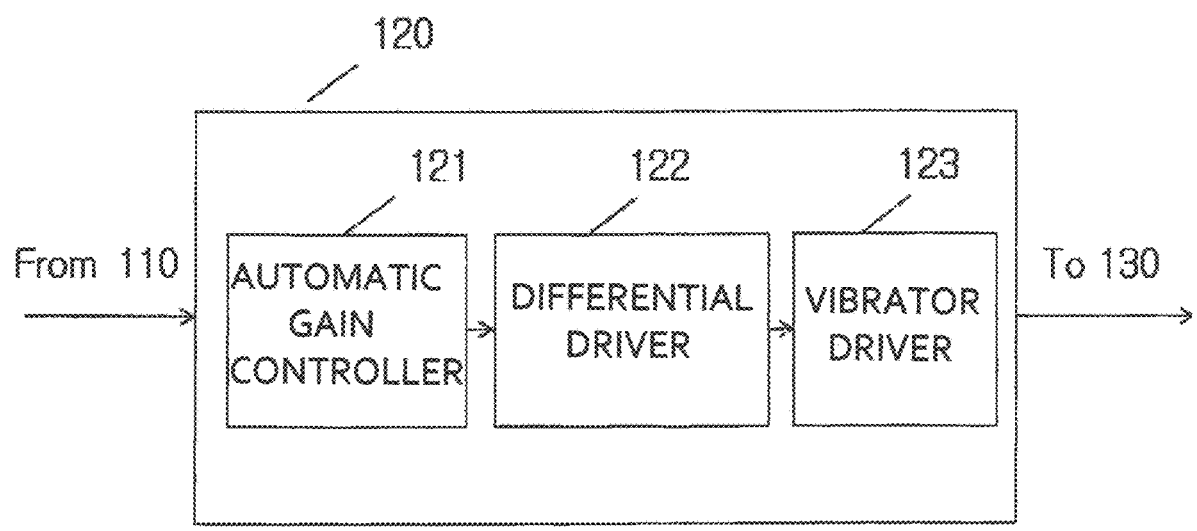

[FIG. 4]
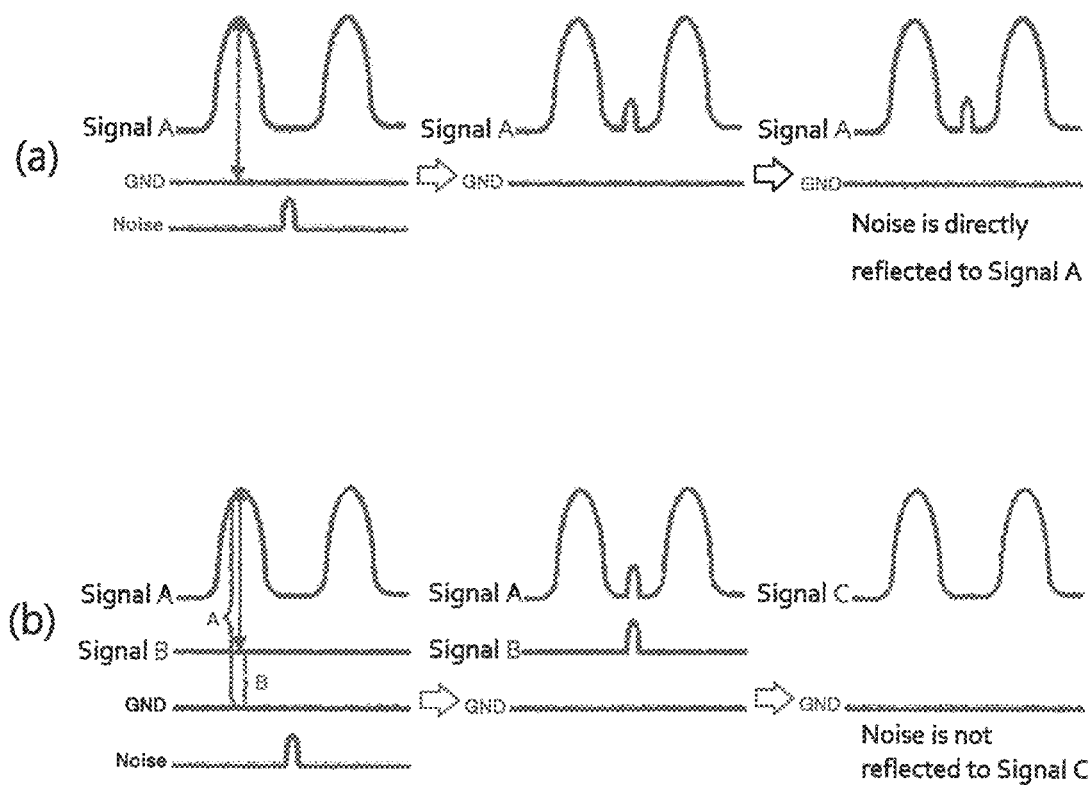

[FIG. 5]
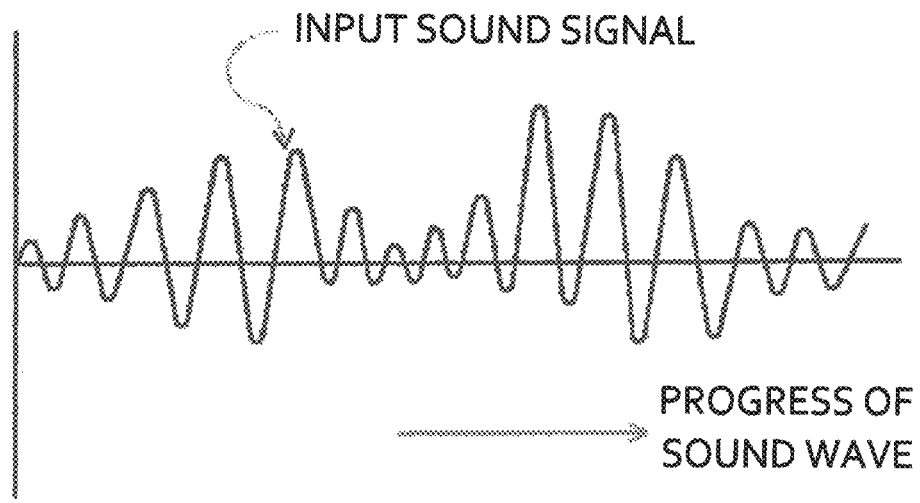
(a)
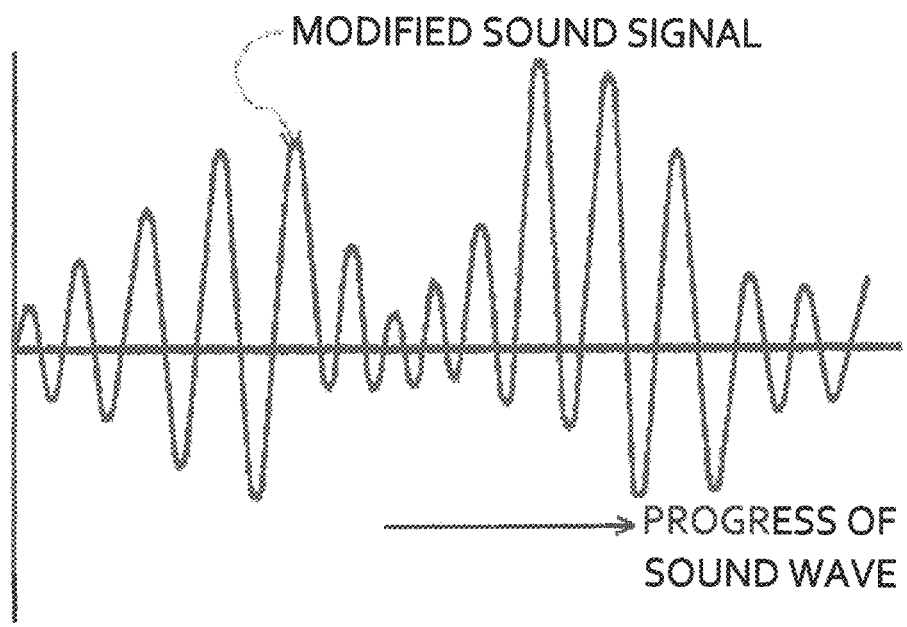
(b)

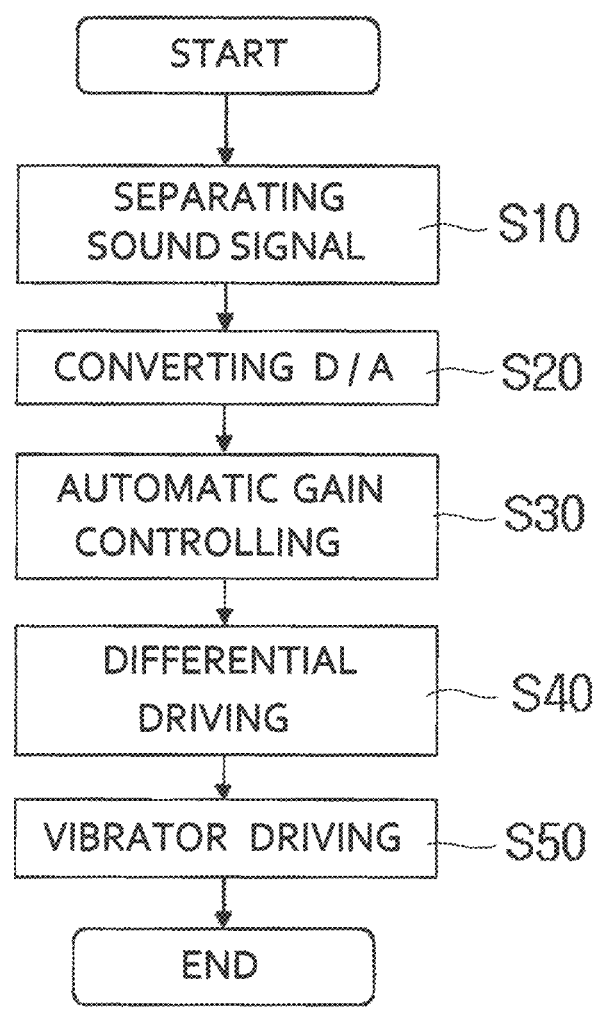
[FIG. 6]

[FIG. 7]
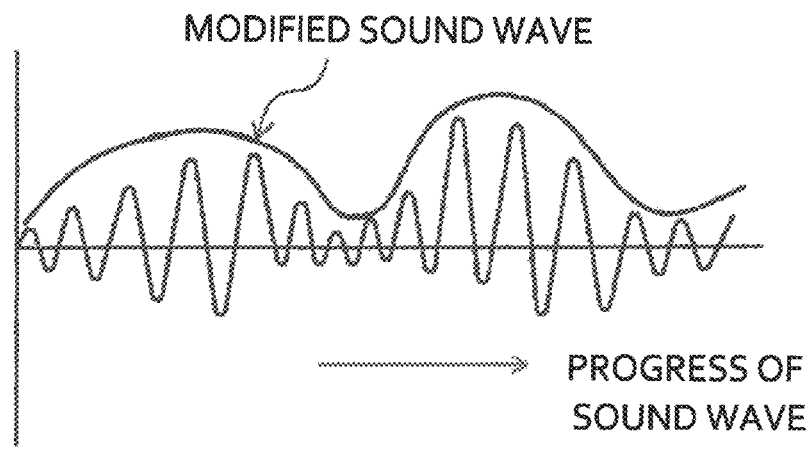
(a)
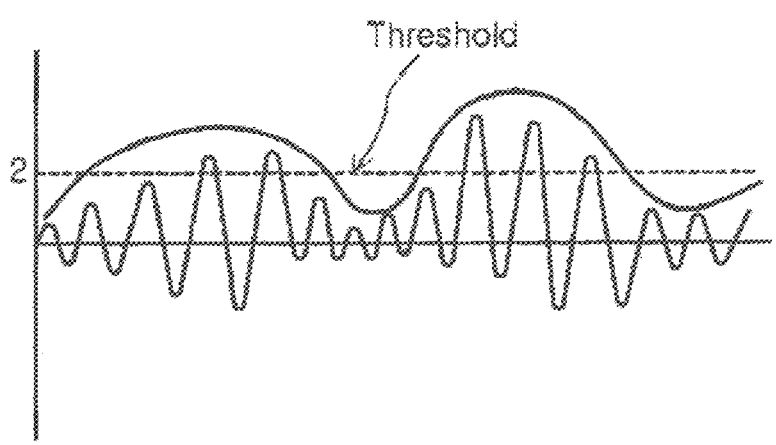
(b)
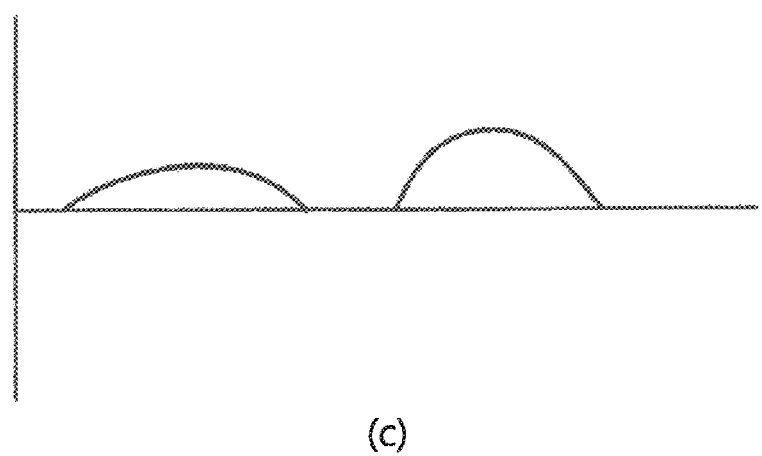
(c)

VIBRATION PROVISION SYSTEM FOR PROVIDING REAL-TIME VIBRATION ACCORDING TO FREQUENCY CHANGE AND VIBRATION PROVISION METHOD THEREFOR

BACKGROUND OF THE INVENTION

Field of the Invention

The present invention relates to a vibration providing system and method for proving a vibration and, more particularly, to a vibration providing system capable of converting a sound signal received from a computer, a game machine, or a portable terminal into a vibration signal capable of vibrating the vibrator dynamically in real time and a method for providing vibration capable of vibrating a vibrator in three dimensions on a real time basis.

Background of the Related Art

Currently, with advances in IT technology, users of computer devices, game machines, and various portable devices are demanding that these devices provide more realistic interactions. Accordingly, there is an increasing interest in a method for providing a hardware environment capable of transmitting tactile information more realistically in addition to the transmission of information through existing visual and auditory information.

In addition, by installing a vibrating motor in a mouse used in a computer device or a variety of game machines, a vibrating mouse for causing the mouse to vibrate according to the contents of the program during use of the program has been proposed and used. In addition, a vibration case capable of vibrating a mobile terminal protective case by being attached at all times to a mobile communication terminal such as a portable terminal has been proposed.

Particularly in recent years, the haptic effect through the mobile terminal has become an important factor in accordance with the tendency that the PC game and the console game are gradually converted into the mobile game, and the haptic function in the portable terminal such as the smartphone having various functions. Accordingly, it is required to develop haptic control technology suitable for a game which shows higher performance and control vibration in a precise manner along with rapid response speed.

As the related art regarding the foregoing, Korean Laid-Open Patent Publication No. 10-2012-0110669 discloses a portable terminal case which is installed in a portable terminal and receives a vibration exclusive signal to vibrate and perform simple vibration.

In addition, Korean Laid-Open Patent Publication No. 10-2014-0065087 also discloses a mobile case installed in a portable terminal and provided with a plurality of vibrators to receive only selection information and cause simple vibration only.

Korean Patent No. 10-0814685 recites a vibration mouse driving device which is capable of a vibration motor with a vibration pattern coincided with an acoustic effect by making a vibration pattern which best suits for the real acoustic effect and outputting the vibration pattern file in a game or an application source along with the acoustic effect. However, a method for rapidly controlling a vibrator according to reaction time is not mentioned.

In addition, Korean Patent Laid-Open No. 10-2015-0059165 discloses a protective case for a portable terminal which is capable of delivering various vibration patterns which can make a user feel synchronized by installing an actuator providing real-time vibration feedback inside the protective case to provide a user with a haptic signal corresponding to an output image and sound as a rapid vibration response, and controlling vibration amount of the actuator according to intensity of vibration or vibration feedback of a cylinder-type vibration motor at a low frequency, but there is a drawback that a method for controlling a rapid vibrator is not disclosed.

In addition, Korean Patent No. 10-0979675 discloses a game accessory for a mobile device. By installing a vibration motor inside the game accessory and a large battery, when a user does a game using a mobile device, vibration in association with sound is provided, and when a battery of a mobile device is discharged, a large battery can be used. However, the above vibration has a vibration method using a linear vibration motor of which response speed is somewhat slower. Thus, this method is not sufficient to make a user feel synchronized due to slow response speed and only a simple type of vibration is provided.

Furthermore, since the vibration motor as the vibration device installed in the conventional portable terminal case needs to convert the sound signal into a digital signal for driving the motor in order to generate vibration associated with the sound, there is a disadvantage in that the configuration is complicated.

Also, considering that the response speed at which a person can feel synchronized vibration together with the visual information is 15 ms or less, the linear motor type vibration device has a slow response speed of 50 to 70 ms and thus, it seems too slow to give a user feel synchronized. In addition, the coin type rotary motor is also used as a simple alarm function since the response speed of the vibration motor is very slow as 100-150 ms.

In addition, the planar linear motor uses the Lateral Force Fields (LFFs) phenomenon and is a motor using a coil and thus, the response speed is slow as 50 to 70 ms. Therefore, the motor is not sufficient to realize the haptic effect.

As described above, the conventional linear motor and the coin-type rotary motor are slow in response speed and stopping speed, resulting in a vibration noise phenomenon due to the vibration redundancy effect when continuous vibration is generated. As a result, the division between the vibration which arrives first and the vibration which arrives later is ambiguous and the synchronized sense corresponding to the visual information cannot be perceived. In addition, it is impossible to control various vibration patterns such as large vibrations and fine vibrations at extremely fast response speed for realizing a haptic function.

In addition, Korean Patent No. 10-0614242 discloses a mobile terminal type sound reproducer for changing the sound output of a portable terminal into vibration. However, the reproducer does not change the sound signal having a frequency change to a vibration having a simultaneous sensation, and provides only a simple alarm function that vibrates to inform the call signal when information is received.

CITED REFERENCES

Patent Publications

Korean Laid-open Patent Publication No. 10-2012-0110669

Korean Laid-open Patent Publication. No. 10-2014-0065087

Korean Patent Publication No. 10-0814685

Korean Laid-open Patent Publication No. 10-20150059165

Korean Patent Publication No. 10-0979675

Korean Patent Publication No. 10-0614242

SUMMARY OF THE INVENTION

Therefore, the present invention has been made to solve the above-mentioned problems occurring in the prior arts, and it is an object of the present invention to provide a vibration providing system which enables a user feel synchronized and reality by providing a haptic signal by vibration feedback suitable for a sound signal received from a computer, a game machine, or a portable terminal to a user with a rapid response speed and providing dynamic vibration according to a frequency on a real-time basis, and a vibration providing method.

In order to achieve the object, a vibration providing system for providing real-time vibration according to a frequency change is disclosed. The vibration providing system includes a communication unit 110 configured to receive a signal which is output from a computer, a game machine, or a portable terminal via wired or wireless communication;

a conversion unit 120 configured to convert a sound signal transmitted from the communication unit 110 to a vibration signal which is capable of driving a vibrator on a real time basis by amplifying the transmitted sound signal; and a vibrator 130 configured to vibrate according to a vibration signal transmitted from the conversion unit 120.

The communication unit 110 includes a signal separator (111) configured to separate a digital sound signal from a received digital composite signal; and a D/A converter 112 configured to convert a digital sound signal separated from the signal separator 111 to an analog signal.

The D/A converter 112 converts only a digital sound signal corresponding to 20 to 20,000 Hz from among the digital sound signals separated from the signal separator 111 into an analog sound signal.

The conversion unit 120 includes an automatic gain controller 121 which amplifies a sound signal having a small amplitude and amplifies a sound signal having a large amplitude to an extent that the signal is not saturated to maintain a gain;

a differential driver 122 which converts the amplified sound signal input from the automatic gain controller 121 to a differential signal to attenuate a noise effect; and a vibrator driver 123 which does not convert an analog sound signal in which effect of noise input from the differential driver 122 is attenuated to a digital signal, amplifies an analog signal as it is, and converts the signal to a vibration signal which vibrates a vibrator.

A portable terminal case equipped with a vibration system is provided.

A vibration mouse equipped with a vibration system is provided.

A method for providing real-time vibration according to a frequency change is provided. The method includes separating only a digital sound signal from a received digital composite signal received from a computer and a game machine through a signal separator 111 (S10);

converting a digital sound signal separated from the signal separator 111 to an analog sound signal through a D/A converter 112 (S20);

amplifying the analog sound signal converted from the D/A converter 112 so that a constant gain is maintained through an automatic gain controller 121 (S30);

attenuating a noise effect by converting the analog sound signal amplified from the automatic gain controller 121 to a differential signal through the differential driver 122 to attenuate a noise effect (S40);

amplifying an analog sound signal in which a noise effect is attenuated by the differential driver 122 to an analog sound signal as it is through the vibrator driver 123 and converting the signal to a vibration signal (S50); and vibrating a vibrator on a real-time basis by receiving a vibration signal of the vibrator driver 123 (S60).

The present invention provides a vibration providing system that provides real-time vibration according to a frequency change. The vibration providing system provides a haptic signal which is suitable for an image and sound output from a portable terminal realistically and rapidly and thus has an effect to transmit information more realistically by visual, auditory, and tactile sense to a hardware environment requiring three-dimensional vibration.

BRIEF DESCRIPTION OF THE DRAWINGS

Further objects and advantages of the invention can be more fully understood from the following detailed description taken in conjunction with the accompanying drawings in which:

FIG. 1 is a configuration diagram which illustrates a concept of a portable terminal case that is an exemplary embodiment of a vibration providing system for providing real-time vibration according to a frequency change, FIG. 2 is a detailed configuration diagram of a communication unit according to an embodiment, FIG. 3 is a detailed configuration diagram of a conversion unit according to an embodiment, FIG. 4 is an exemplary diagram regarding immunity of noise in a single ended signal and a differential signal, FIG. 5 is an exemplary diagram of a method for driving a vibrator according to an embodiment, FIG. 6 is a flowchart for driving a vibrator according to a frequency of a sound signal according to an embodiment, and FIG. 7 is an exemplary diagram of a conventional method for driving a vibrator.

DETAILED DESCRIPTION OF THE PREFERRED EMBODIMENT

The preferred embodiments of the invention will be hereinafter described in more detail with reference to the accompanying drawings.

Embodiments of the present invention will be described in more detail hereinafter with reference to the accompanying drawings. The present invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and sizes of respective elements may be exaggerated for clarity.

FIG. 1 is a configuration diagram which illustrates a concept of a portable terminal case that is an exemplary embodiment of a vibration providing system for providing real-time vibration according to a frequency change, FIG. 2 is a detailed configuration diagram of a communication unit according to an embodiment, FIG. 3 is a detailed configuration diagram of a conversion unit according to an embodiment, FIG. 4 is an exemplary diagram regarding immunity of noise in a single ended signal and a differential signal, FIG. 5 is an exemplary diagram of a method for driving a vibrator according to an embodiment, FIG. 6 is a flowchart for driving a vibrator according to a frequency of a sound signal according to an embodiment, and FIG. 7 is an exemplary diagram of a conventional method for driving a vibrator.

As illustrated in FIGS. 1 to 3, a vibration providing system 10 for providing real-time vibration according to a frequency change according to an embodiment of the present invention includes a communication unit 110, a conversion unit 120, and a vibrator 130.

In the present invention, the portable terminal case C is exemplified as an embodiment in which the vibration providing system 10 is mounted. However, the present invention is not limited thereto, and the vibration providing system may be mounted to a mobile terminal, a mouse, a game machine, a game machine stick, a computer main body, or the like.

The main body 100 of the portable terminal case C on which the vibration providing system 10 is mounted is formed with a size and a space in which a portable terminal (not shown) can be accommodated. The main body functions as a protective case to prohibit the accommodated portable terminal from being damaged and serves to provide a haptic signal corresponding to an image and sound outputted from a portable terminal to a user in a realistic manner with a rapid Vibration response.

The communication unit 110 is provided inside the main body 100 and receives a signal including a sound signal output from the portable terminal by wired or wireless communication with the portable terminal.

As illustrated in FIG. 2, the communication unit 110 may include a signal separator 111 for separating a digital sound signal from a digital composite signal received from a portable terminal, and a D/A converter 112 which converts the digital sound signal separated from the signal separator 111 to an analog signal.

Here, the signal separator 111 is configured to extract only a digital sound signal from a digital composite signal in the USB format.

The D/A converter 112 converts only a digital sound signal corresponding to 20 to 20,000 Hz out of the digital sound signals separated by the signal separator 111 into an analog sound signal.

The sound signal converted to an analog signal by the D/A converter 112 is transmitted to the conversion unit 120.

The conversion unit 120 is provided inside the main body 100 and converts the analog sound signal received by the communication unit 110 into a vibration signal capable of driving the vibrator in real time. As illustrated in FIG. 3, the conversion unit 120 may include an automatic gain controller 121, a differential driver 122, and a vibrator driver 123.

Here, the automatic gain controller 121 adjusts the amplitude of the analog sound signal received from the communication unit 110 so as to minimize the occurrence of noise by amplifying a signal having a large amplitude. From among the analog sound signal transmitted from the communication unit 110, a sound signal with a small amplitude is amplified and a signal having a large amplitude is amplified to an extent that it is not saturated, so that a constant gain can be maintained. The amplified sound signal passing through the automatic gain controller 121 is transmitted to the differential driver 122.

The differential driver 122 converts a single-ended signal input from the automatic gain controller 121 into a differential signal to attenuate the influence of ambient noise and transmit the signal to the vibrator driver 123.

In the case of a single-ended signal, since there is only one signal line to the ground, it is affected directly by the ambient noise. In contrast, in the case of the differential signal, since there are two signal lines to the ground, both of two signal lines are affected. Therefore, there is no large change in characteristics due to the difference in characteristics between the two signal lines. As a result, the noise can be minimized or attenuated by operating as if there is influence of noise. (See FIG. 4(*a*), (*b*))

The vibrator driver 123 does not convert the analog sound signal in which effect of noise input from the differential driver 122 is attenuated into a digital signal, and amplifies the analog signal as it is, converting the signal into a vibration signal for driving a vibrator, since a vibrator is operating with high voltage.

As illustrated in FIG. 3 and FIGS. 5(*a*) and (*b*), the vibrator driver 123 amplifies the input analog sound signal as it is as an analog sound signal, and transmits it to the vibrator 130 as a vibration signal.

Therefore, since the vibrator driver 123 according to the present invention does not need to convert an analog sound signal into a digital signal in order to drive the vibrator, the response time is not required, so that the response speed is increased. Consequently, the analog sound signal amplified in accordance with the frequency change of the sound signal becomes a vibration signal so that the vibrator can be driven in real time to vibrate.

In this case, amplification ratio can be controlled to control vibration intensity of the vibrator.

The conventional vibrator driver cannot be directly driven by an analog signal because the reaction speed is very slow at about 50 to 70 ms. Thus, the peak detector method shown in FIGS. 7(*a*), (*b*), and (*c*), that is, a method of identifying and extracting a signal which is larger than the threshold voltage of the vibrator among the signals having passed through the low-pass filter is used. Then, the extracted signal passes through a complicated method to be converted to a digital signal to drive the vibration motor again.

The vibrator 130 is disposed inside the main body 100 of the portable terminal case according to the present invention and is driven in accordance with the vibration signal transmitted from the vibrator driver 123 to vibrate the main body 100. The vibrator may be constituted by at least one or more vibrators.

Hereinbelow, a flow of providing vibration by vibrating a vibrator in accordance with a change in frequency of a sound signal will be described by steps.

The communication unit 110 of the vibration providing system 10 receives a digital composite signal from a portable terminal, a computer, or a game machine, and separates only the digital sound signal through the signal separator 111 in step 310.

The digital sound signal separated by the signal separator 111 of the step 310 is converted into an analog signal through the D/A converter 112 in step 320.

At this time, the D/A converter 112 converts only a digital sound signal corresponding to 20 to 20,000 Hz out of the digital sound signals separated by the signal separator 111 into an analog sound signal.

The sound signal converted into the analog signal from the D/A converter 112 in step 320 is transmitted to the automatic gain controller 121 of the conversion unit 120 and amplified to maintain a constant gain in step 330.

At this time, the automatic gain controller 121 amplifies a signal having a small frequency among the received sound signals and amplifies the signal having a large frequency only to a degree that it is not saturated, thereby adjusting the signal to minimize noise generation. The amplified signal having passed through the automatic gain controller 121 is transmitted to the differential driver 122.

The analog sound signal amplified by the automatic gain controller 121 in step 330 is converted into a differential signal through the differential driver 122 to minimize or attenuate the influence of ambient noise in step S40.

The analog sound signal converted by the differential driver 122 in step S40 is amplified as it is as an analog sound signal through the vibrator driver 123 and transmitted to the vibrator 130 as a vibration signal in step S50.

Here, the vibrator driver 123 amplifies the inputted analog sound signal as it is, converts the amplified analog sound signal into a vibration signal, and transmits the vibration signal to the vibrator and thus, the vibrator vibrates according to the frequency change of the inputted analog sound signal in step S60.

In addition, the vibrator adjusts intensity of vibration by adjusting amplification ratio of an analog sound signal.

While the present invention have been described in connection with the exemplary embodiments illustrated in the drawings, it will be appreciated that they are merely an illustrative embodiments and various equivalent modifications and variations of the embodiments can be made by a person having an ordinary skill in the art without departing from the spirit and scope of the present invention. Therefore, the appended claims also include such modifications and variations falling within the true technical scope of the present invention.

What is claimed is:

1. A vibration providing system for providing real-time vibration according to a frequency change, the vibration providing system comprising:
   a communication unit 110 configured to receive a signal which is output from a computer, a game machine, or a portable terminal via wired or wireless communication; and
   a conversion unit 120 configured to convert a sound signal transmitted from the communication unit 110 to a vibration signal for driving a vibrator 130 on a real time basis by amplifying the transmitted sound signal,
   wherein the vibrator 130 is configured to vibrate according to the vibration signal, and
   wherein the communication unit 110 comprises:
   a signal separator 111 configured to separate a digital sound signal from a received digital composite signal; and
   a D/A converter 112 configured to convert the digital sound signal separated from the signal separator 111 to an analog signal.

2. The vibration providing system as claimed in claim 1, wherein the D/A converter 112 converts the digital sound signal separated from the signal separator 111 into an analog sound signal only when the digital sound signal corresponds to an analog signal of 20 to 20,000 Hz.

3. A portable terminal case equipped with the vibration system of claim 2.

4. A vibration mouse equipped with the vibration system of claim claim 2.

5. A portable terminal case equipped with the vibration system of claim 1.

6. A vibration mouse equipped with the vibration system of claim 1.

7. A vibration providing system for providing real-time vibration according to a frequency change, the vibration providing system comprising:
   a communication unit 110 configured to receive a signal which is output from a computer, a game machine, or a portable terminal via wired or wireless communication; and
   a conversion unit 120 configured to convert a sound signal transmitted from the communication unit 110 to a vibration signal for driving a vibrator 130 on a real time basis by amplifying the transmitted sound signal,
   wherein the vibrator 130 is configured to vibrate according to the vibration signal,
   wherein the conversion unit 120 comprises:
   an automatic gain controller 121 which amplifies the sound signal transmitted from the communication unit 110 when the sound signal has a small amplitude, and amplifies the sound signal transmitted from the communication unit 110 when the sound signal has a large amplitude to an extent that the amplified sound signal is not saturated to maintain a gain;
   a differential driver 122 which converts the amplified sound signal input from the automatic gain controller 121 to a differential signal to attenuate a noise effect; and
   a vibrator driver 123 which does not convert an analog sound signal in which an effect of noise input from the differential driver 122 is attenuated to a digital signal, amplifies an analog signal as it is, and converts the signal to the vibration signal which vibrates the vibrator.

8. A portable terminal case equipped with the vibration system of claim 7.

9. A vibration mouse equipped with the vibration system of claim claim 7.

10. A method for providing real-time vibration according to a frequency change, the method comprising:
   separating only a digital sound signal from a received digital composite signal received from a computer and a game machine through a signal separator 111 (S10);
   converting the digital sound signal separated from the signal separator 111 to an analog sound signal through a D/A converter 112 (S20);
   amplifying the analog sound signal converted from the D/A converter 112 so that a constant gain is maintained through an automatic gain controller 121 (S30);
   attenuating a noise effect (S40) by converting the analog sound signal amplified from the automatic gain controller 121 to a differential signal through a differential driver 122 to attenuate the noise effect (S40);
   amplifying the differential signal in which the noise effect is attenuated by the differential driver 122; and converting the amplified differential signal to a vibration signal (S50) through a vibrator driver 123; and
   vibrating a vibrator on a real-time basis by receiving the vibration signal (S50) of the vibrator driver 123 (S60).

* * * * *